(12) United States Patent
Zhu et al.

(10) Patent No.: US 7,098,591 B1
(45) Date of Patent: Aug. 29, 2006

(54) TRANSPARENT ELECTRODE MATERIAL FOR QUALITY ENHANCEMENT OF OLED DEVICES

(75) Inventors: Furong Zhu, Singapore (SG); Ewald Karl Michael Guenther, Singapore (SG); Soo Jin Chua, Singapore (SG)

(73) Assignees: Osram Opto Semiconductors GmbH, Regensburg (DE); Institute of Materials Research and Engineering, Singapore (SG)

( * ) Notice: Subject to any disclaimer, the term of this patent is extended or adjusted under 35 U.S.C. 154(b) by 0 days.

(21) Appl. No.: 10/168,249

(22) PCT Filed: Dec. 17, 1999

(86) PCT No.: PCT/SG99/00144

§ 371 (c)(1),
(2), (4) Date: Oct. 30, 2002

(87) PCT Pub. No.: WO01/45182

PCT Pub. Date: Jun. 21, 2001

(51) Int. Cl.
*H05B 33/00* (2006.01)

(52) U.S. Cl. .......................... 313/506; 313/504; 445/24
(58) Field of Classification Search ......... 313/504–512, 313/503, 498; 445/24, 25
See application file for complete search history.

(56) References Cited

U.S. PATENT DOCUMENTS

| | | | | |
|---|---|---|---|---|
| RE31,708 E | * | 10/1984 | Gordon | 427/126.2 |
| 5,512,364 A | * | 4/1996 | Chiba et al. | 428/332 |
| 5,703,436 A | | 12/1997 | Forrest et al. | |
| 5,844,363 A | * | 12/1998 | Gu et al. | 313/506 |
| 5,998,926 A | * | 12/1999 | Tsuruoka et al. | 313/506 |
| 6,522,067 B1 | * | 2/2003 | Graff et al. | 313/512 |
| 6,569,548 B1 | * | 5/2003 | Yamamoto et al. | 428/702 |

FOREIGN PATENT DOCUMENTS

| | | |
|---|---|---|
| EP | 0729191 A2 | 8/1996 |
| JP | 09 097679 | 4/1997 |
| WO | WO98/07173 | 12/1998 |

OTHER PUBLICATIONS

Burrows, P.E. et al. Achieving full–color organic light emitting devices for lightweight, flat–panel displays, Electron Devices, IEEE Transactions on, vol.: 44 Issue: 8, Aug. 1997. pp. 1188–1203. [online], http://ieeexplore.ieee.org/login.html?url=/iel/16/13266/00605453.pdf.

Examination Report, Application Ser. No. DE 19983995.6–33, Apr. 29, 2005, 4 pp.

Zhu, F. et al. "Optimized indium tin oxide contact for organic light emitting diode applications, accepted by Thin Solid Films", 2000, Elsevier Science S. A., pp. 314–317 no month.

Zhang, K. et al., "Effect of Hydrogen Partial Pressure on Optoelectronic Properties of Indium–Tin–Oxide Thin Films Deposited by Radio Frequency Magnetron Sputtering Method", Jul. 15, 1999, Journal of Applied Physics, vol. 86, No. 2, pp. 97–980.

Parker, I.D., "Carrier tunneling and device characteristics in polymer light–emitting diodes", Feb. 1, 1994, Journal of Applied Physics, vol. 75, No. 3, pp. 1656–1666.

Kim, J.S. et al., "Indium–tin oxide treatment for single–and double–layer polymerica light–emitting diode: The relation between the anode physical, chemical, and morphological properties and the device peformance", Dec. 15, 1998, Journal of Applied Physics, vol. 84, No. 12, pp. 6859–6870.

* cited by examiner

*Primary Examiner*—Joseph Williams
(74) *Attorney, Agent, or Firm*—Fish & Richardson P.C.

(57) ABSTRACT

A transparent conductive material in which the desired resistivity is achieved with a high carrier concentration is provided for use in an OLED. In one embodiment, the transparent conductive material comprises indium-tin-oxide. (ITO) with a high carrier concentration of at least at least $7 \times 10^{20}$ cm$^{-3}$. The high carrier concentration improved the performance of the OLED device.

25 Claims, 6 Drawing Sheets

TRANSPARENT ELECTRODE MATERIAL FOR QUALITY ENHANCEMENT OF OLED DEVICES

FIELD OF THE INVENTION

The present invention relates to organic light emitting diode (OLED) devices. More particularly, the invention relates to an improved transparent electrode material for use in OLED devices.

BACKGROUND OF THE INVENTION

OLED devices are used, for example, to form displays such as flat panel displays (FPDs). The displays are used in many different products such as pagers, cellular phones, and personal organizers. Typically, an OLED comprises one or more organic functional layers sandwiched between two electrodes. Charge carriers are injected through the electrodes and recombine in the functional layers, thereby emitting visible radiation.

One of the electrodes is formed from a transparent conductive material, enabling the radiation to be seen. The transparent conductive material should possess low resistivity, high optical transmittance, and appropriate work function to produce an OLED device with adequate performance.

A transparent electrode material that is useful in OLED applications is indium-tin-oxide (ITO) due to its high transparency in the visible wavelength range. ITO is commonly used in liquid crystal display (LCD) applications. However, resistivity and work function of the ITO used in LCD applications do not meet the requirements for OLED applications. This leads to lower performance in OLED devices, making portable applications which operate on battery power impractical.

Also, the surface morphology (roughness) of ITO layers used in LCD is not suited for OLED applications. Typically, LCD applications require the surface of the ITO to be rough in order to promote adhesion of the polyimide coating. The rough ITO surface produces high electric fields, which can be detrimental for OLEDs. For example, the high electric fields can induce electrical shorts since the electrodes are only separated by a distance of about 100–200 nm (the usual thickness of the organic functional layer stack).

As evidenced from the above discussion, it is desirable to provide a transparent conductive layer that meets the needs for OLED applications.

SUMMARY OF THE INVENTION

The invention relates to organic LED (OLED) devices. The OLED device includes an OLED stack in the device region of a substrate. The OLED stack comprises first and second conductive electrodes separated by at least one organic functional layer. One of the electrodes is formed from a transparent conductive material. In accordance with the invention, the transparent conductive material comprises a desired resistivity achieved with a high carrier concentration. Providing the transparent conductive material having the desired resistivity achieved with a high carrier concentration has been found to improve device performance. In one embodiment, the carrier concentration of the transparent conductive layer is at least $7 \times 10^{20}$ cm$^{-3}$.

PREFERRED EMBODIMENTS OF THE INVENTION

The invention relates generally to OLED devices. In particular, the invention provides a transparent conductive material that increases the performance of OLED devices. In one embodiment, the transparent conductive material comprises indium-tin-oxide (ITO). Other types of transparent conductive materials, such as indium-zinc-oxide, zinc-oxide, tin-oxide, are useful.

We have discovered that for a given resistivity, the concentration of charge carriers in the transparent conductive material can impact the performance of the OLED device. The concentration of charge carriers in the transparent conductive material has a direct relationship to the performance of the OLED device. In one embodiment, the transparent conductive material comprises a high charge carrier concentration to improve the efficiency of the OLED device. Preferably, the transparent conductive material comprises as high a charge carrier concentration as possible.

Figure 1:
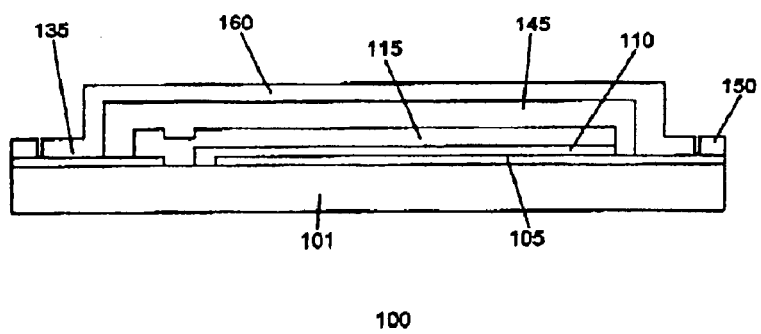
FIG. 1 shows an embodiment of the invention.

FIG. 1 shows an OLED device 100 in accordance with one embodiment of the invention. The OLED device comprises one or more organic functional layers 110 between first and second electrodes 105 and 115 formed on a substrate 101. The substrate, in one embodiment comprises a transparent material. The electrodes can be patterned to form, for example, a plurality of OLED cells to create a pixelated OLED device. Bond pads 150, which are coupled to the first and second electrodes, are provided to enable electrical connections to the OLED cells. A cap 160 is provided to encapsulate the device.

One of the electrodes comprises a transparent conductive material. Typically, the first electrode which, for example, is on the transparent substrate 101 is transparent. The transparent conductive material, in one embodiment, comprises ITO. The resistivity in the ITO is sufficiently low to satisfy the requirements for OLED applications. In one embodiment, the resistivity of the ITO is less than or equal to about $4 \times 10^{-4}$ Ω-cm. The resistivity is related to carrier mobility and carrier concentration of the material.

In accordance with the invention, the desired resistivity of the ITO is achieved with a high carrier concentration. In one embodiment, the carrier concentration of the ITO is at least about $7 \times 10^{20}$ cm$^{-3}$. The high carrier concentration has been found to improve performance in the OLED device. This results in lower power consumption, making OLED applications more feasible for portable applications.

Figure 2:
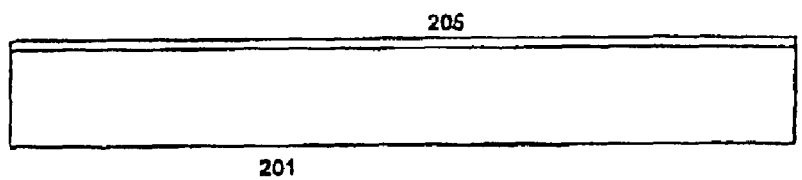
FIGS. 2–6 show a process for fabricating an OLED device in accordance with one embodiment of the invention.

FIGS. 2–6 show a process for fabricating an OLED device in accordance with one embodiment of the invention. Referring to FIG. 2, a substrate 201 is provided on which OLED cell or cells are formed. In one embodiment, a transparent substrate is provided. The substrata usually comprises soda lime or borosilicate glass. Other types of glass materials can also be used to serve as the substrate. Typically, the substrate is about 0.4–1.1 mm thick. The use of thinner substrates, for example about 20–300 μm, is also useful A transparent conductive layer 205 is deposited on the substrate surface. The transparent conductive material, in one embodiment comprises ITO. Other transparent conductive materials, such as indium-zinc-oxide, zinc-oxide, tin-oxide, can also be useful. The thickness of the ITO typically is about 40–400 nm. Processing problems may arise if the ITO is too thick. In one embodiment, the ITO is less than or equal to 150 nm thick. Preferably, the ITO layer is about 120 to 150 nm thick. The resistivity of the ITO is less than or equal to about $4 \times 10^{-4}$ Ωcm.

In one embodiment, the ITO layer is sputtered onto the substrate using, for example, a radio frequency magnetron sputtering tool. The deposition parameters, such as temperature, pressure, process gas mixture, and deposition rate, are controlled such that the resistivity of the deposited ITO layer is achieved with a high carrier concentration. In one embodiment, the charge carrier concentration of the ITO is at least about $7 \times 10^{20}$ cm$^{-3}$. Preferably, the ITO comprises as high a charge carrier concentration as possible. The high carrier concentration enhances hole-injection, leading to an increase in electroluminescent efficiency.

The ITO is sputtered using an oxidized target comprising, for example, $In_2O_3$ and $SnO_2$. The weight proportion of the $In_2O_3$ and $SnO_2$ in the target is about 9:1. Other compositions and types of targets can also be used. The deposition parameters of the sputtering process can be as follows:

| | |
|---|---|
| substrate temperature | : 300–400° C. |
| processing pressure | : $10^{-3}$–$10^{-5}$ Torr |
| processing gas mixture | : Ar, $H_2$ |
| deposition rate | : 1–10 nm/min; preferably 1–2 nm/min |

Alternative deposition techniques, such as chemical vapor deposition (CVD), plasma enhanced CVD, or laser ablation, may also be useful in depositing the ITO layer The deposited ITO layer comprises good optical characteristics and appropriate work function to satisfy the requirements of OLED applications. In one embodiment, the ITO has an optical transmittance in the visible wavelength range of over 85%. The work function of the ITO should closely match the ionization potential of the subsequently formed organic functional layers. In one embodiment, the ITO comprises a work function of about 4.8–5.2 eV.

Preferably, the surface of the ITO is relatively smooth to reduce the presence of electric fields which may lead to shorts. In one embodiment, the root mean square (RMS) roughness of the ITO surface is less than about 2 nm to reduce the possibility of shorts caused by strong electric fields.

Figure 3:
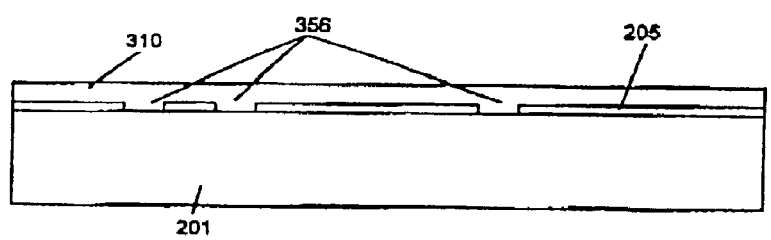

Referring to FIG. 3, the conductive layer 205 is patterned as desired to selectively remove portions of the layer, exposing portions 356 of the substrate. The patterned conductive layer serves as for example, the anode for the OLED cells. In one embodiment, the conductive layer is patterned to form strips that serve the anode of a pixelated OLED device. The patterning process can also form connections for bond pads.

One or more functional organic layers 310 are deposited on the substrate, covering the exposed substrate portions and the conductive layer. The functional organic layers comprise, for example, conjugated polymer or $Alq_3$. Other types of functional organic layers are also useful. The thickness of the organic layers is typically about 2–200 nm.

Figure 4:
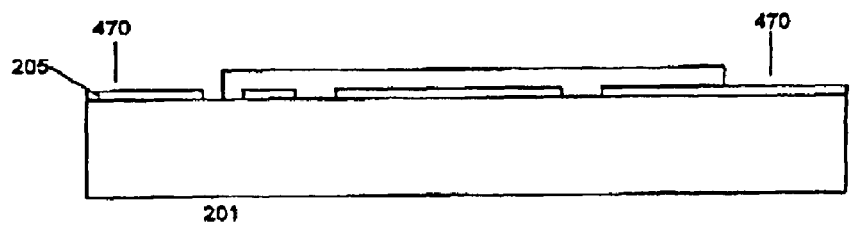

Referring to FIG. 4, portions of the organic layers are selectively removed, for example, to expose underlying layers in regions 470 for bond pad connections. Selective removal of the organic layers can be achieved by a polishing process. Other techniques, such as etching, scratching, or laser ablation, can also be used to selectively remove portions of the organic layers.

Figure 5:
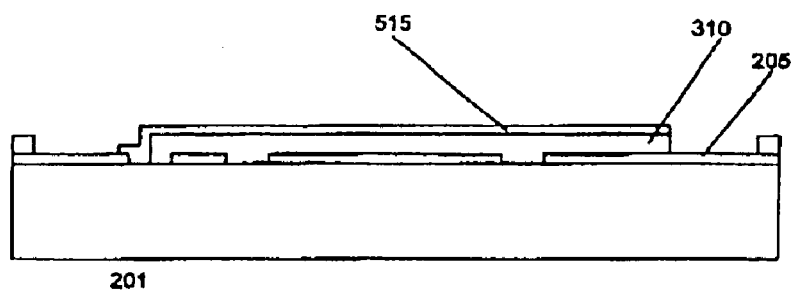

Referring to FIG. 5, a second conductive layer 515 is deposited on the substrate. The conductive layer comprises, for example, Ca, Mg, Ba, Ag, Al or a mixture or alloy thereof. Other conductive materials, particularly those comprising a low work function, can also be used to form the second conductive layer. In one embodiment, the second conductive layer is patterned to form electrode strips that serve as cathodes for a pixelated OLED device. Also, connections for bond pads can be formed during the patterning process. Alternatively, the conductive layer can be selectively deposited to form cathode strips and bond pad connections. Selective deposition of the conductive layer can be achieved with, for example, a mask layer. The cathode strips are typically orthogonal to the anode strips. Forming cathode strips that are diagonal to the anode strips is also useful. The intersections of the top and bottom electrode strips form organic LED pixels.

Figure 6:
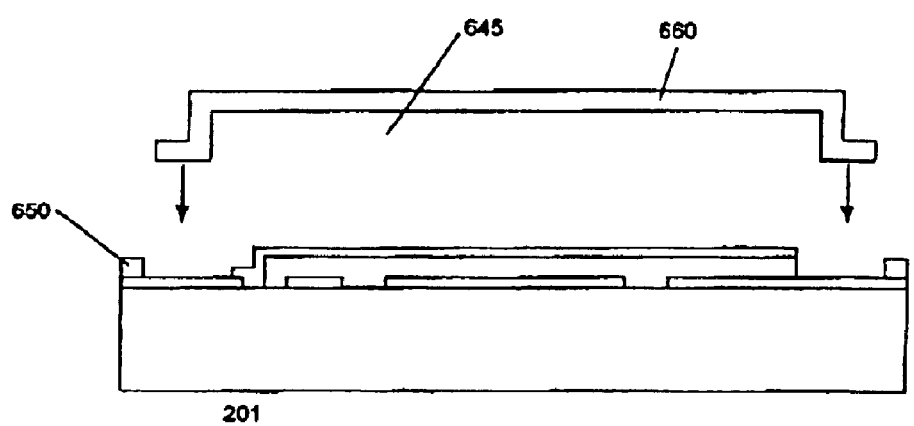

Referring to FIG. 6, a cap 660 is mounted on the substrate to encapsulate the device. The cap layer comprises, for example, metal or glass. Other types of cap which protect the active components from the environment, such as ceramic or metallized foil, are also useful. Various techniques can be used to mount the cap layer. In one embodiment, an adhesive is used to mount the cap layer. Adhesives such as self-hardening adhesives, UV or thermal curable adhesives, or hot melt adhesives are useful. Other techniques which employ low temperature solder materials, ultrasonic bonding, or welding techniques using inductance or laser welding are also useful. When mounted, the cap creates a cavity 645, providing separation between it and the OLED cells. Bond pads 650 are formed to provide electrical access to the OLED cells.

Experiments

A first OLED device was fabricated using a fluorine based polymeric organic functional material. The organic functional material was sandwiched between a transparent conductive anode and a metallic cathode. The metallic cathode comprised a 50 nm thick Ca layer covered by a 200 nm thick Ag layer. The transparent conductive anode comprised ITO with a resistivity of $2.7 \times 10^{-4}$ Ωcm and a charge carrier concentration of $9 \times 10^{20}$ cm$^{-3}$.

The ITO was deposited on a glass substrate using a radio frequency magnetron sputter in argon-hydrogen mixture. An oxidized target with $In_2O_3$ and $SnO_2$ having a weight proportion of 9:1 was used. The base pressure of the system was about $5.0 \times 10^{-8}$ Torr. The total pressure of the sputtering gas mixture was adjusted to $3.0 \times 10^{-3}$ Torr during deposition. The hydrogen partial pressure was about $7–9 \times 10^{-5}$ Torr. The ITO was deposited at the temperature of about 300–400° C.

A second OLED device was fabricated. The second OLED device was identical to the first except the ITO had a resistivity of $3.2 \times 10^{-4}$ Ωcm and a charge carrier concentration of $5 \times 10^{20}$ cm$^{-3}$. This ITO film was prepared with only argon during the sputtering process. The rest of the deposition parameters were kept the same as those used for producing the first OLED device.

An experiment was conducted to compare the efficiency of the two OLED devices. A linear bias ramp was applied to the devices while simultaneously monitoring OLED current as well as luminance. The device efficiency was determined by dividing luminance and current density. The first device with the high carrier concentration of $9 \times 10^{20}$ cm$^{-3}$ achieved a maximum efficiency of 4.14 cd/A. This was 1.5 times higher than the maximum efficiency achieved with the second device having a lower carrier concentration of $5 \times 10^{20}$ cm$^{-3}$.

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

What is claimed is:

1. An organic LED (OLED) device comprising:
   a substrate with a device region; and
   an OLED stack in the device region, wherein the OLED stack comprises:
      a transparent conductive layer serving as a first electrode, the transparent conductive layer comprising indium-tin-oxide with a resistivity of less than or equal to about $4\times10^{-4}$ Ωcm achieved with a carrier concentration of at least about $7\times10^{20}$ cm$^{-3}$,
      a conductive layer serving as a second electrode, and
      at least one organic functional layer separating the first and second electrodes;
   wherein the transparent conductive layer comprises a work function closely matching an ionization potential of the at least one organic functional layer.

2. The device of claim 1 wherein the transparent conductive layer comprises an optical transmittance in the visible wavelength range >85%.

3. The device of claim 1 wherein a surface of the transparent conductive layer comprises an RMS roughness <2 nm.

4. The device of claim 1 wherein the transparent conductive layer comprises an optical transmittance in the visible wavelength range >85% and an RMS surface roughness <2 nm.

5. The device of claim 1 wherein the carrier concentration is about $7\times10^{20}$ cm$^{-3}$ to about $9\times10^{20}$ cm$^{-3}$.

6. The device of claim 5 wherein the transparent conductive layer comprises an optical transmittance in the visible wavelength range >85%.

7. The device of claim 5 wherein a surface of the transparent conductive layer comprises an RMS roughness <2 nm.

8. The device of claim 5 wherein the transparent conductive layer comprises an optical transmittance in the visible wavelength range <85% and an RMS surface roughness <2 nm.

9. The device of claim 1, wherein the transparent conductive layer is deposited on the substrate in an argon-hydrogen atmosphere.

10. A method for fabricating an organic LED (OLED) device comprising:
    providing a substrate;
    depositing a transparent conductive layer on the substrate, wherein the transparent conductive layer serves as a first electrode and comprises indium-tin-oxide with a resistivity of less than or equal to about $4\times10^{-4}$ Ωcm achieved with a carrier concentration of at least about $7\times10^{20}$ cm$^{-3}$; and
    processing the substrate to form an OLED stack, comprising
    depositing a functional organic layer over the first electrode; wherein the transparent conductive layer comprises a work function closely matching an ionization potential of the organic functional layer; and
    depositing a conductive layer over the functional organic layer to serve as a second electrode.

11. The method of claim 10 wherein depositing the transparent conductive layer comprises sputtering the transparent conductive layer on the substrate.

12. The method of claim 10 wherein the transparent conductive layer comprises an optical transmittance in the visible wavelength range >85%.

13. The method of claim 10 wherein a surface of the transparent conductive layer comprises as RMS roughness <2 nm.

14. The method of claim 10 wherein the transparent conductive layer comprises an optical transmittance in the visible wavelength range >85% and an RMS surface roughness <2 nm.

15. The method of claim 10 wherein the carrier concentration is about $7\times10^{20}$ cm$^{-3}$ to about $9\times10^{20}$ cm$^{-3}$.

16. The method of claim 10, wherein depositing a transparent conductive layer includes depositing the transparent conductive layer in an argon-hydrogen atmosphere.

17. An organic light emitting device (OLED), comprising:
    a substrate with a device region; and
    an OLED stack in the device region, the OLED stack comprising:
       a transparent conductive layer as a first electrode serving as an anode, the transparent conductive layer having a resistivity of less than or equal to about $4\times10^{-4}$ Ωcm achieved with a hole concentration of at least about $7\times10^{20}$ cm$^{-3}$;
       a conductive layer serves as a second electrode; and
       at least one organic functional layer separating the first and second electrodes.
    wherein the transparent conductive layer comprises a work function closely matching an ionization potential of the at least one organic functional layer.

18. The device of claim 17, wherein the transparent conductive layer comprises an optical transmittance in the visible wavelength range >85%.

19. The device of claim 17 wherein a surface of the transparent conductive layer comprises a RMS roughness <2 nm.

20. The device of claim 17 wherein the transparent conductive layer comprises an optical transmittance in the visible wavelength range >85% and an RMS surface roughness <2 nm.

21. The device of claim 17 wherein the carrier concentration is $7\times10^{20}$ cm$^{-3}$ to about $9\times10^{20}$ cm$^{-3}$.

22. The device of claim 17 wherein the transparent conductive layer comprises a material selected from the group consisting of indium-zinc-oxide, zinc-oxide and tin-oxide.

23. The device of claim 17 wherein the transparent conductive layer comprises indium-tin-oxide.

24. The device of claim 17, wherein the transparent conductive layer is deposited on the substrate in an argon-hydrogen atmosphere.

25. The method of claim 10, wherein processing the substrate to form an OLED stack further comprises:
    patterning the transparent conductive layer to form the first electrode;
    patterning the conductive layer over the functional organic layer to form the second electrode, wherein the functional organic layer between the patterned first and second electrodes forms the OLED stack; and mounting a cap on the substrate to encapsulate the OLED stack.

* * * * *

UNITED STATES PATENT AND TRADEMARK OFFICE
CERTIFICATE OF CORRECTION

PATENT NO. : 7,098,591 B1
APPLICATION NO. : 10/168249
DATED : August 29, 2006
INVENTOR(S) : Furong Zhu, Ewald Karl Michael Guenther and Soo Jin Chua It is certified that error appears in the above-identified patent and that said Letters Patent is hereby corrected as shown below:

On the Title Page, (56) References Cited, Other Publications, Zhang reference; replace:
"No. 2, pp. 97-980" with
--No. 2, pp. 974-980--

On the Title Page, (57) Abstract, third sentence; replace:
"(ITO) with a high carrier concentration of at least at least $7 \times 10^{20}$cm$^{-3}$." with
--(ITO) with a high carrier concentration of at least $7 \times 10^{20}$cm$^{-3}$.--

Column 5, Line 40 at Claim 8; replace:
"wavelength range <85%" with
--wavelength range >85%--

Signed and Sealed this

Twenty-seventh Day of March, 2007

JON W. DUDAS
*Director of the United States Patent and Trademark Office*